US 9,841,483 B2

(12) United States Patent
Wheaton et al.

(10) Patent No.: US 9,841,483 B2
(45) Date of Patent: Dec. 12, 2017

(54) MAGNETIC RESONANCE IMAGING METHOD AND MAGNETIC RESONANCE IMAGING APPARATUS

(71) Applicant: Toshiba Medical Systems Corporation, Otawara-shi (JP)

(72) Inventors: Andrew J. Wheaton, Shaker Heights, OH (US); Wayne R. Dannels, Mentor, OH (US)

(73) Assignee: Toshiba Medical Systems Corporation, Otawara-shi (JP)

( * ) Notice: Subject to any disclaimer, the term of this patent is extended or adjusted under 35 U.S.C. 154(b) by 596 days.

(21) Appl. No.: 14/554,916

(22) Filed: Nov. 26, 2014

(65) Prior Publication Data

US 2016/0146917 A1     May 26, 2016

(51) Int. Cl.
*G01R 33/565* (2006.01)
*G01R 33/561* (2006.01)

(52) U.S. Cl.
CPC .... *G01R 33/56536* (2013.01); *G01R 33/5611* (2013.01)

(58) Field of Classification Search
CPC ........ G01R 33/56563; G01R 33/56536; G01R 33/5611; G01R 33/56554; G01R 33/565
See application file for complete search history.

(56) References Cited

U.S. PATENT DOCUMENTS

| 5,757,188 | A  | 5/1998  | Miyazaki     |
| 7,071,690 | B2 | 7/2006  | Butts et al. |
| 7,821,264 | B2 | 10/2010 | Koch et al.  |
| 7,928,729 | B2 | 4/2011  | Hargreaves et al. |
| 7,952,356 | B2 | 5/2011  | Koch et al.  |
| 2009/0292197 | A1* | 11/2009 | Fuderer ............. G01R 33/5615 600/410 |

OTHER PUBLICATIONS

Artz N.S. et al., "Spectrally Resolved Fully Phase-Encoded Three-Dimensional Fast Spin-Echo Imaging", Magnetic Resonance in Medicine 71(2):681-690 (2014).
Artz N. et al., "Multiband RF Excitation for Accelerating Magnetic Resonance Imaging in the Presence of Metal", Proc. Intl. Soc. Mag. Reson. Med. 22:650 (2014).
Butts K. et al., "Reduction of Blurring in View Angle Tilting MRI", Magnetic Resonance in Medicine 53:418-424 (2005).

(Continued)

*Primary Examiner* — Melissa Koval
*Assistant Examiner* — Rishi Patel
(74) *Attorney, Agent, or Firm* — Oblon, McClelland, Maier & Neustadt, L.L.P.

(57) ABSTRACT

In one embodiment a magnetic resonance imaging method includes the steps of comparing a first image and a second image to determine whether there is a distorted region present in the first image or the second image, each of the first image and second image having a total field of view that is the distance of the image along an axis, assigning an affected field of view to a width of the distorted region, determining an acceleration factor by dividing the total field of view of one or both of the first image and the second image by the affected field of view, acquiring sampled image data according to the acceleration factor of one or both of the first image and the second image and applying a mask to a third image in the affected field of view.

17 Claims, 11 Drawing Sheets

(56) References Cited

OTHER PUBLICATIONS

Cho Z.H. et al., "Total Inhomogeneity Correction Including Chemical Shifts and Susceptibility by View Angle Tilting", Medical Physics 15(1):7-11 (Jan./Feb. 1988).

Gomori J.M. et al., "Fat Suppression by Section-Select Gradient Reversal on Spin-Echo MR Imaging", Radiology 168:493-495 (1988).

Hargreaves B.A. et al., "Accelerated Slice Encoding for Metal Artifact Correction", Journal of Magnetic Resonance Imaging, 31:987-996 (2010).

Hargreaves B.A. et al., "Adaptive Slice Encoding for Metal Artifact Correction", Joint Annual Meeting 1-7:3083 (2010).

Koch K.M. et al. "Imaging Near Metal With a MAVRIC-SEMAC Hybrid", Magnetic Resonance in Medicine 65:71-82 (2011).

Koch K.M. et al., "A Multispectral Three-Dimensional Acquisition Technique for Imaging Near Metal Implants", Magnetic Resonance in Medicine 61:381-390 (2009).

Lu W. et al., "SEMAC: Slice Encoding for Metal Artifact Correction in MRI", Magnetic Resonance in Medicine 62:66-76 (2009).

Olsen R.V. et al., "Metal Artifact Reduction Sequence: Early Clinical Applications", RadioGraphics 20:699-712 (2000).

Smith M.R. et al., "Accelerating Sequences in the Presence of Metal by Exploiting the Spatial Distribution of Off-Resonance", Magnetic Resonance in Medicine 72(6):1658-1667 (Dec. 2014).

Sveinsson B. et al., "Hexagonal Undersampling for Faster MRI Near Metallic Implants", Magnetic Resonance in Medicine (7 pages) (Feb. 18, 2014).

Van Gorp J.S. et al., "A Hybrid Multi-Spectral Approach for Near Metal Imaging: Combining the Beast of Phase and Frequency Encoding", Proc. Intl. Soc. Mag. Reson. Med. 22:1681 (2014).

Worters P.W. et al., "Compressed-Sensing Multispectral Imaging of the Postoperative Spine", Journal of Magnetic Resonance Imaging 37:243-248 (2013).

Yoon D. et al., "Fast SEMAC by Separation of On-Resonance and Off-Resonance Signals", Proc. Intl. Soc. Mag. Reson. Med. 22:0091 (2014).

\* cited by examiner

MAGNETIC RESONANCE IMAGING METHOD AND MAGNETIC RESONANCE IMAGING APPARATUS

FIELD

Embodiments described herein relate generally to a MRI (magnetic resonance imaging) apparatus, MRI methods and MRI systems.

BACKGROUND

Magnetic resonance imaging (MM) is an imaging scan method that magnetically excites nuclear spins of a subject placed in a magnetostatic field by a radio frequency (RF) pulse having a Larmor frequency thereof, to generate an image from magnetic resonance signal data generated with the excitation.

Several patients that are candidates for MRI have varying metal elements implanted within their bodies. These metal elements can be of many different types, including staples and other surgical implements, dental elements such as crowns and fillings, fixation devices such as plates, screws and pins, artificial joints, including hip implants and artificial knees, and pacemakers and other implantable electrical devices. Typically a metal artifact consists of an area of zero signal in an MRI, often with a high intensity rim on one or two edges, with neighboring regions showing a marked distortion. These distortion and signal problems are due to most metals having higher susceptibilities to magnetization than the body tissues they are surrounded by, thereby creating large magnetic field inhomogeneities around the metal object.

Typical methods for adjusting for metal elements can increase scan times or not resolve the signal and distortion issues caused by the metal element.

An object of the present disclosure is to provide a magnetic resonance imaging apparatus and a magnetic resonance imaging method that can scan a region of a patient that includes a metal element with less distortion.

BRIEF DESCRIPTION OF THE DRAWINGS

The present disclosure will be better understood by reference to the following drawings of which.

DETAILED DESCRIPTION

In one exemplary embodiment a magnetic resonance imaging method is disclosed. The method includes the steps of selecting a first set of RF pulses, applying the first set of RF pulses to a portion of an object, generating a first image in response to signal data obtained from the first set of RF pulses, selecting a second set of RF pulses, wherein at least one pulse of the second set of RF pulses has a different gradient than one of the pulses of the first set of RF pulses, applying the second set of RF pulses to the same portion of the object as the first set of RF pulses, generating a second image in response to signal data obtained from the second set of RF pulses, comparing the first image and the second image to determine whether there is a distorted region present in the first image or the second image, each of the first image and second image having a total field of view that is the distance of the image along an axis, assigning an affected field of view to a width of the distorted region along the axis of one or both of the first image and the second image, determining an acceleration factor by dividing the total field of view of one or both of the first image and the second image by the affected field of view, acquiring sampled image data according to the acceleration factor of one or both of the first image and the second image, generating a third image from the acquired sampled image data and applying a mask to the third image in the affected field of view and displaying the third image.

One of the uses of the present disclosure is to provide a scout for sampling techniques such as Slice Encoding for Metal Artifact Correction (SEMAC), discussed in U.S. Pat. No. 7,928,729 to Hargreaves, et al., which is incorporated herein by reference. These uses are discussed below. As discussed below this scout can determine a distorted portion of a section of an object, which can then be used to determine acceleration factor (R) for sampling k space and can be used to determine and place an anti-alias mask on an image.

Figure 1:
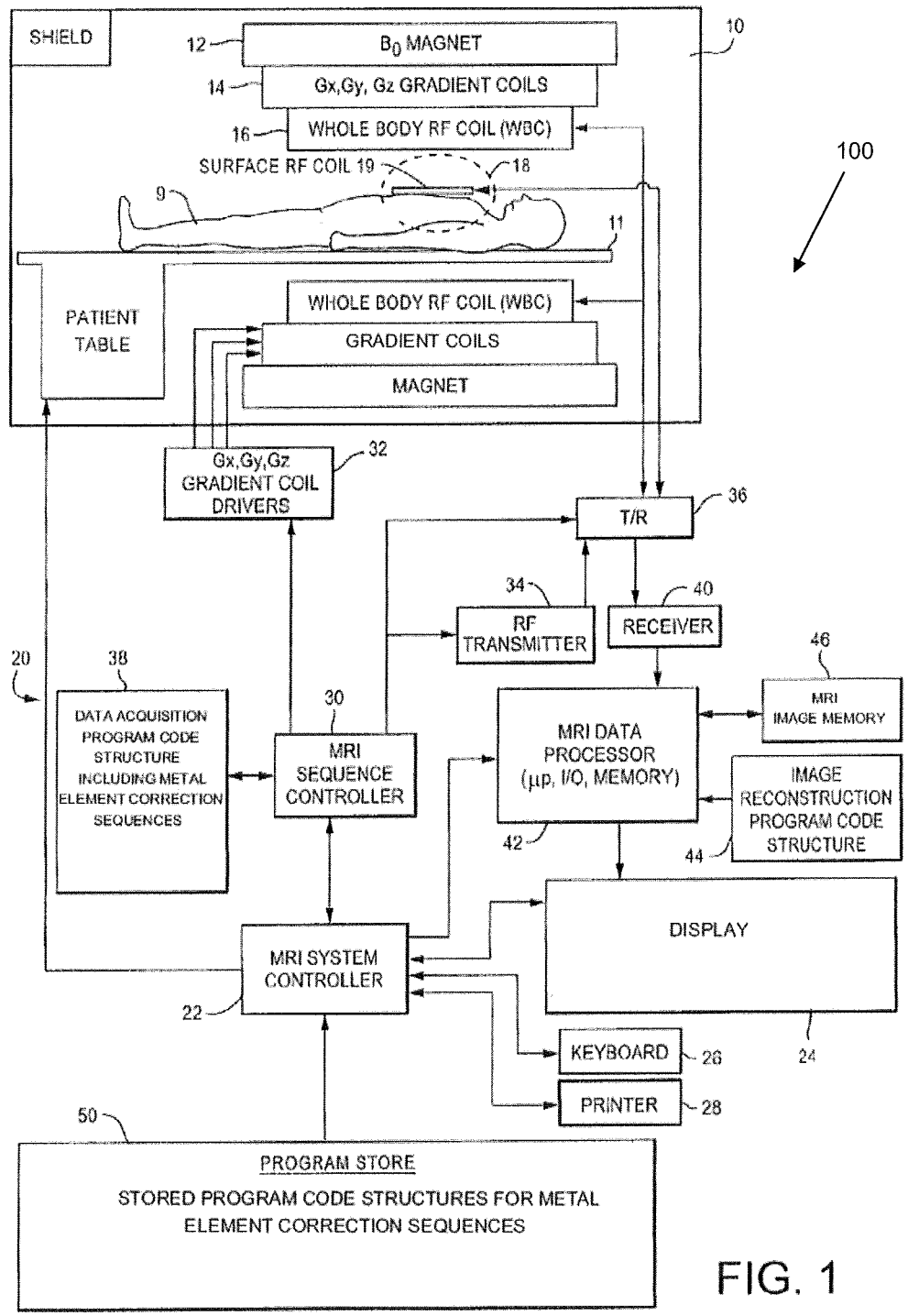
FIG. 1 is a schematic block diagram of an exemplary MRI system configured to perform metal element correction.

FIG. 1 is a block diagram illustrating a magnetic resonance imaging (MRI) apparatus 100 according to the first embodiment of the present disclosure.

The MRI apparatus 100 shown in FIG. 1 includes a gantry 10 (shown in schematic cross section) and various related system components 20 interfaced therewith. At least the gantry 10 is typically located in a shielded room. One MRI system geometry depicted in FIG. 1 includes a substantially coaxial cylindrical arrangement of the static field $B_0$ magnet 12, a Gx, Gy and Gz gradient coil set 14 and a large whole body RF coil (WBC) assembly 16. Along the horizontal axis of the cylindrical array of elements is an imaging volume 18 shown as substantially encompassing the chest of a patient 9 supported by a patient table 11. A smaller RF coil 19 is shown as more closely coupled to the chest of the patient 9 in image volume 18. RF coil 19 can be a surface coil or array or the like and can be customized or shaped for particular body parts, such as skulls, arms, shoulders, elbows, wrists, knees, legs, chests, spines, etc. An MRI system controller 22 interfaces with MRI sequence controller 30, which, in turn controls the Gx, Gy and Gz gradient coil drivers 32, as well as the RF transmitter 34 and the transmit/receive switch 36 (if the same RF coil is used for both transmission and reception). The MRI sequence controller 30 includes suitable program code structure 38 for implementing data acquisition sequences in the presence of metal elements, which later can be employed in conjunction with other (e.g. conventional or known diagnostic) MRI sequences. The MRI system controller 22 also can optionally interface with a printer 28, a keyboard 26 and a display 24

The various related system components 20 includes an RF receiver 40 providing input to data processor 42, which is configured to create processed image data, which is then sent to display 24. The MRI data processor 42 is also configured for access to previously acquired data acquisitions in the presence of metal elements stored in MRI image memory 46, and to correct/compensate MR image data, such as according to programs from program code structure 50, or as according to programs from MRI image reconstruction program code structure 44.

Also illustrated in FIG. 1 is a generalized depiction of an MRI system program store 50 where stored program code structures (e.g., for defining graphical user interfaces and accepting operator inputs to the graphical user interface, etc.) are stored in non-transitory computer-readable storage media accessible to the various data processing components of the MRI system. The program store 50 may be segmented and directly connected, at least in part, to different elements of the various related system components 20 as needed.

FIG. 1 depicts a simplified diagram of an MRI system with some modifications so as to practice exemplary embodiments described herein. The system components can be divided into different collections of "boxes" and can include numerous digital signal processors, microprocessors and special purpose processing circuits that are capable of performing, for example, fast analog/digital conversions, Fourier transforms and array processing. Each of these processors can be a clocked "state machine" wherein the physical data processing circuits progress from one physical state to another upon the occurrence of each clock cycle (or predetermined number of clock cycles.)

Not only can the physical state of processing circuits (e.g., CPU's, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of a metal element corrected imaging reconstruction process, an array of computer-readable accessible data value storage sites in physical storage media will be transformed from some prior state (e.g., all uniform "zero values of all "one" values) to a new state wherein the physical states at the physical sites of such an array vary between minimum and maximum values to represent real world physical events and conditions (e.g., the internal physical structures of a patient over an imaged volume space). Such arrays of stored data values represent and also constitute a physical structure-as does a particular structure of computer control program codes that, when sequentially loaded into instruction registers and executed by one or more CPUs of the various related system components 20, causes a particular sequence of operational states to occur and be transitioned through within the MRI system.

The embodiments described below provide improved ways to process data acquisitions and to generate and display MR images.

Figure 2:
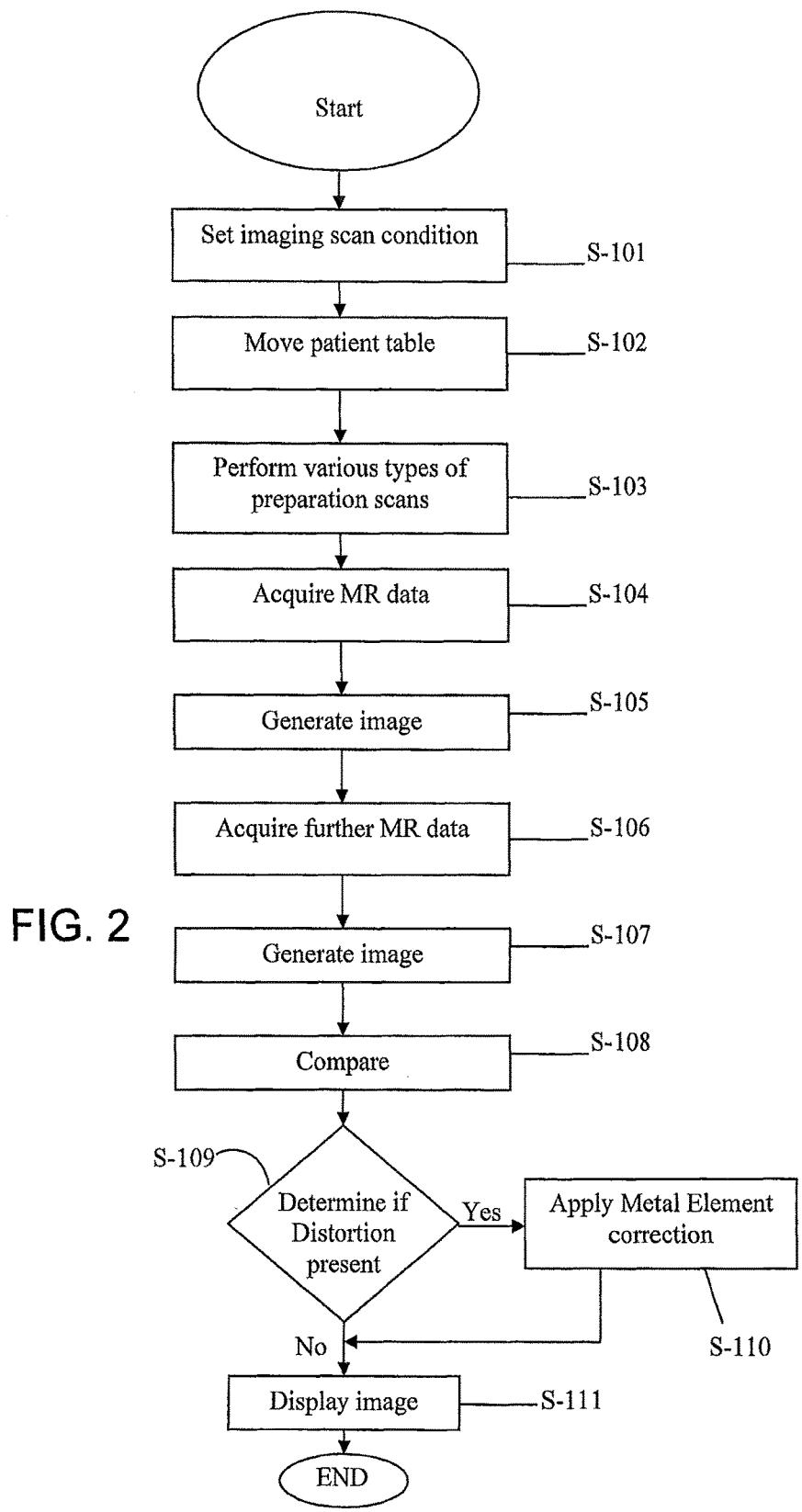
FIG. 2 is an flowchart of a process in an exemplary embodiment.

FIG. 2 is a flowchart of a process of a first embodiment. The MRI sequence controller 30 receives an input through MRI system controller 22 from operator image scan conditions and a position of an object or a patient's body to be scanned (S-101). The MRI sequence controller 30 then causes patient table 11 to move into the appropriate position based on the area to be scanned (S-102).

MRI sequence controller 30 can perform various types of preparation scans (S-103). For example, the preparation scans can include scans for acquiring profile data indicating the sensitivity of each coil element (or each channel) in an array direction, scans for acquiring sensitivity maps indicating the sensitivity distribution of each coil element (or each channel), scans for acquiring spectrum data for obtaining a center frequency of the RF pulse, and scans for obtaining a current value that is caused to flow in a correction coil (not shown) in order to adjust the uniformity of the magnetostatic field. The sensitivity maps are generally acquired before the image generation process but generally do not need to be acquired prior to the imaging scan, discussed below.

The MRI sequence controller 30 controls selection and execution of a first RF pulse or set of RF pulses based on the sequence information to acquire MR data of one section of the patient's body (S-104). This first set can include two RF pulses, with each set able to include an excite RF pulse followed by one or more refocus RF pulses. In one embodiment, the MRI sequence controller 30 acquires this MR data in S-104 using a spin echo (SE) set of RF pulses. The portion of the patient's body the section is acquired in can be any suitable portion, including the legs, torso, arms and head.

Figure 3:
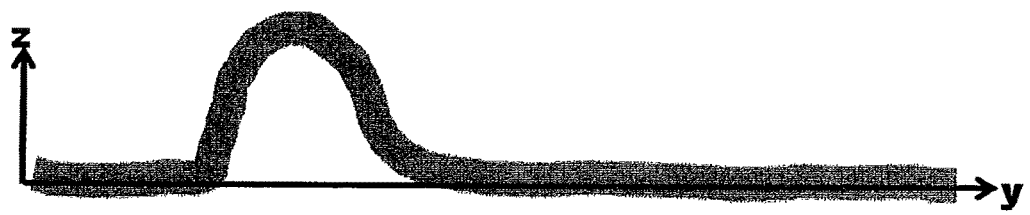
FIG. 3 is an exemplary image of a section.
Figure 5:
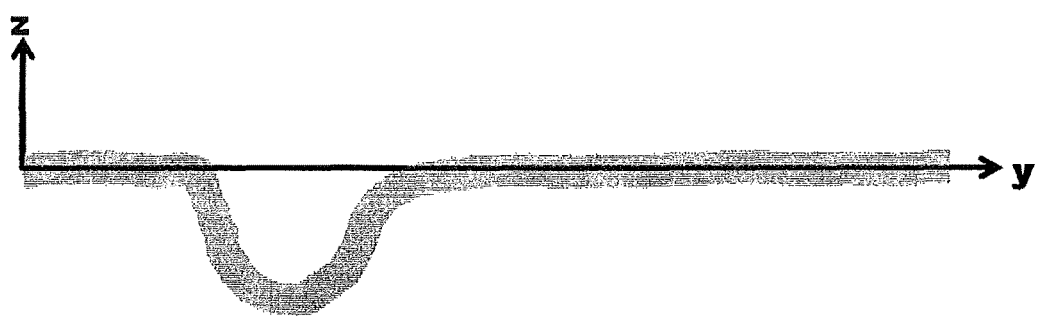
FIG. 5 is a an exemplary image of the selection with a different gradient.
Figure 6:
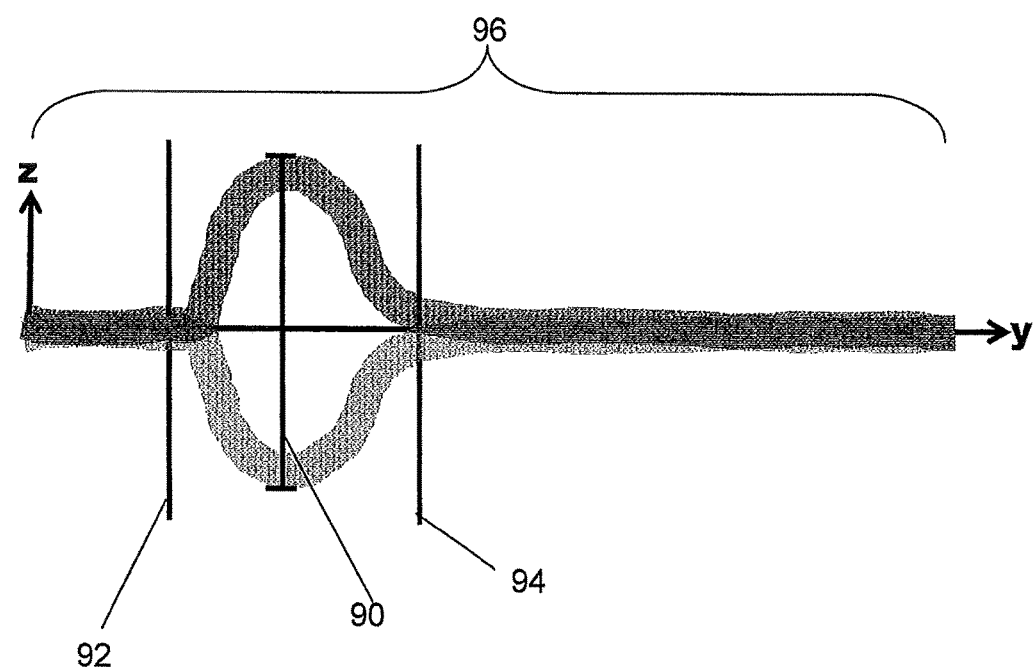
FIG. 6 is exemplary image of the compared sections.

When S-104 includes a set of RF pulses, the acquired k-space data is received by MRI data processor 42, which samples the data along an encoded axis (in this case, the y axis) to generate a first image (S-105). An example of this data is shown in FIG. 3, which is data from a first set of RF pulses. Although FIG. 3 shows an image of the data, this image does not need to be a fully resolved image in two or more dimensions. The image of FIG. 3, as well as those of FIG. 5 and FIG. 6, are for illustrative purposes, but the described method and system and apparatus only needs to process one dimension of raw k-space data to represent at least one dimension of spatially resolved data. For example, the images of FIGS. 3, 5 and 6 could be one-dimensional profiles, which can represent MR signal intensity that has been projected or integrated along a direction. Thus, although image is referred to in the present application, it is intended to include representations of one, two and three dimensions of spatially resolved data.

The MRI sequence controller 30 controls selection and execution of a second RF pulse or set of RF pulses to acquire a second set of MR data of the same section of the patient's body (S-106).

If in S-104 one first RF pulse is selected, then in S-106 a second RF pulse is selected that is at a different gradient than the first RF pulse or at a different bandwidth than the first RF pulse or at a different gradient and a different bandwidth than the first RF pulse.

If in S-104 a set of RF pulses is selected, then in S-106 a set of RF pulses is selected. In this second set of RF pulses at least one pulse has a different gradient than one of the pulses in the first set of RF pulses, such as a gradient of a different polarity or a different amplitude. In this embodiment, each pulse of the second set of RF pulses can have a different gradient than each pulse of the first set of RF pulses, or each pulse of the first set of RF pulses can have a different gradient than each pulse of the second set of RF pulses. Thus, between the two pulses of the first set of RF pulses and the two pulses of the second set of RF pulses, there is at least two different gradients among the four pulses and up to four different gradients among the four pulses.

FIGS. 4A-D illustrate some examples of different ways of modifying gradients in S-106, with respect to gradients in S-104.

Figure 4A:
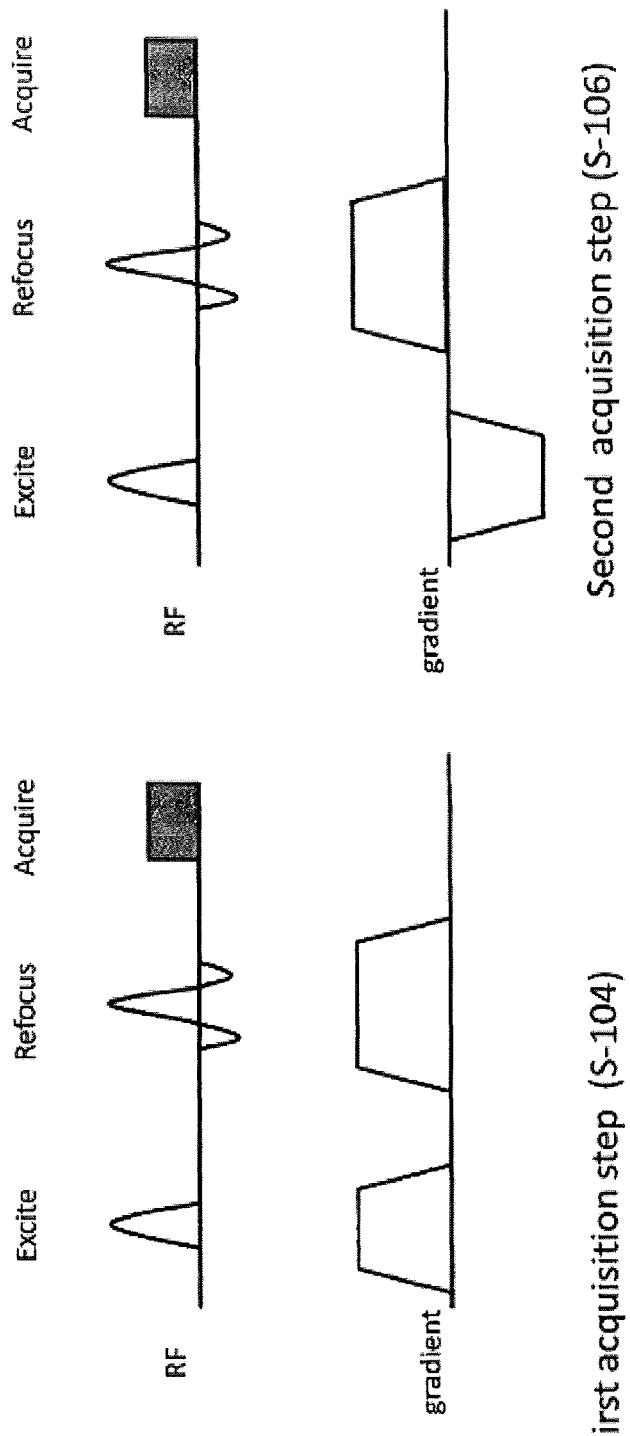
FIGS. 4A-4D are some examples illustrating gradient variations between steps.

FIG. 4A represents RF pulses in S-104, and RF pulses as in S-106. In FIG. 4A, the gradient associated with any excite RF pulse in S-106 are of the same magnitude, but have opposite polarity. As the magnitude of the modified gradients remain unchanged, no change may be required for the bandwidth of the RF pulses.

Figure 4B:
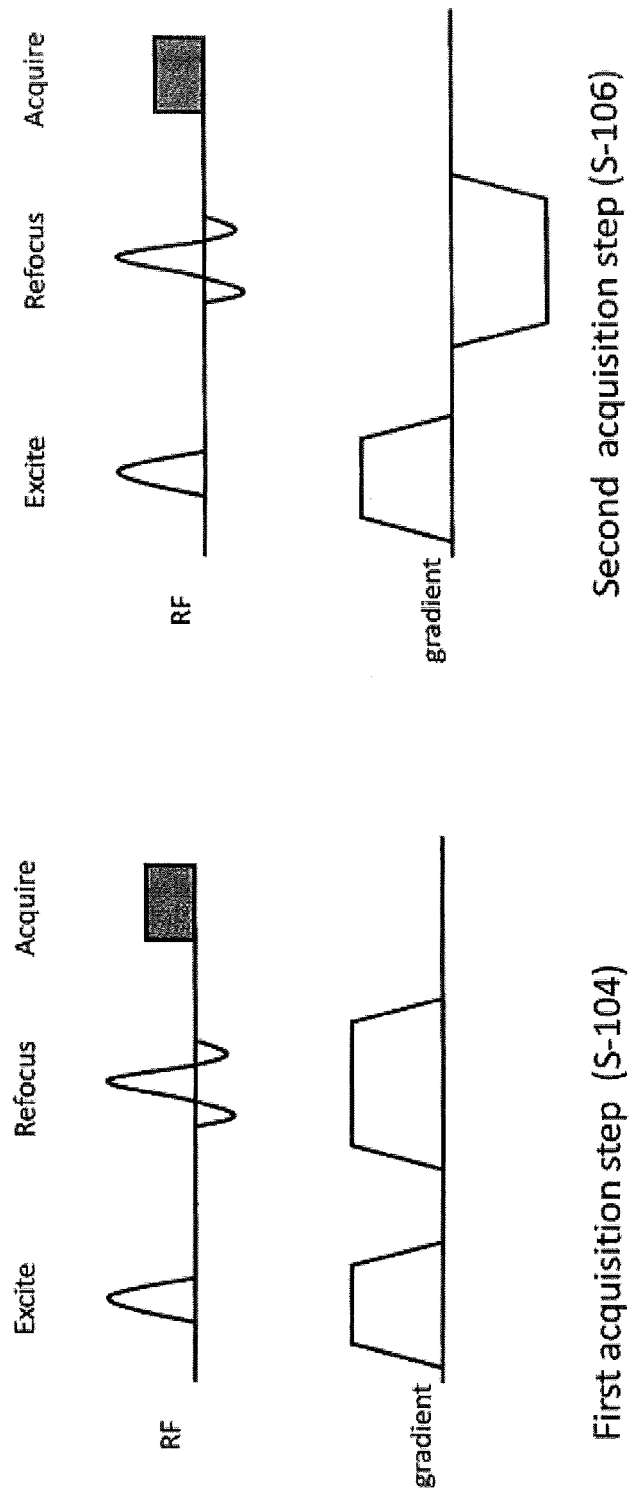

FIG. 4B represents RF pulses in S-104, and RF pulses in S-106. In FIG. 4B, gradients associated with any refocus pulse in the second acquisition step are changed.

Figure 4C:
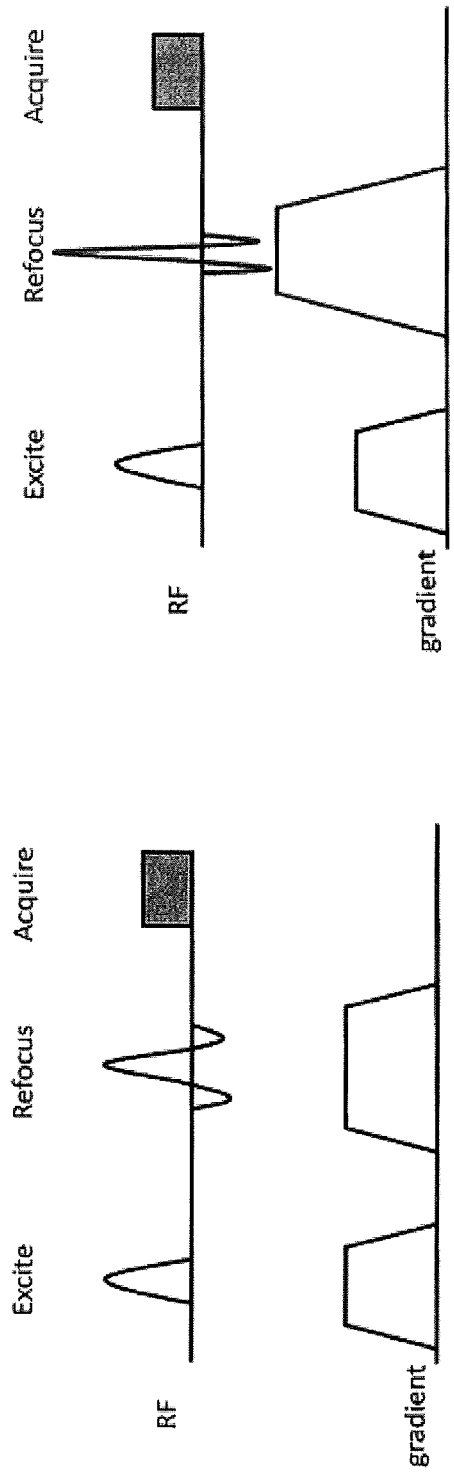

FIG. 4C represents RF pulses in S-104, and RF pulses in S-106. In FIG. 4C, gradients associated with any refocus pulse are changed. Since the overall magnitude of a gradient is changed, a corresponding change is made to the bandwidth of any RF pulse associated with the changed gradient magnitudes.

Figure 4D:
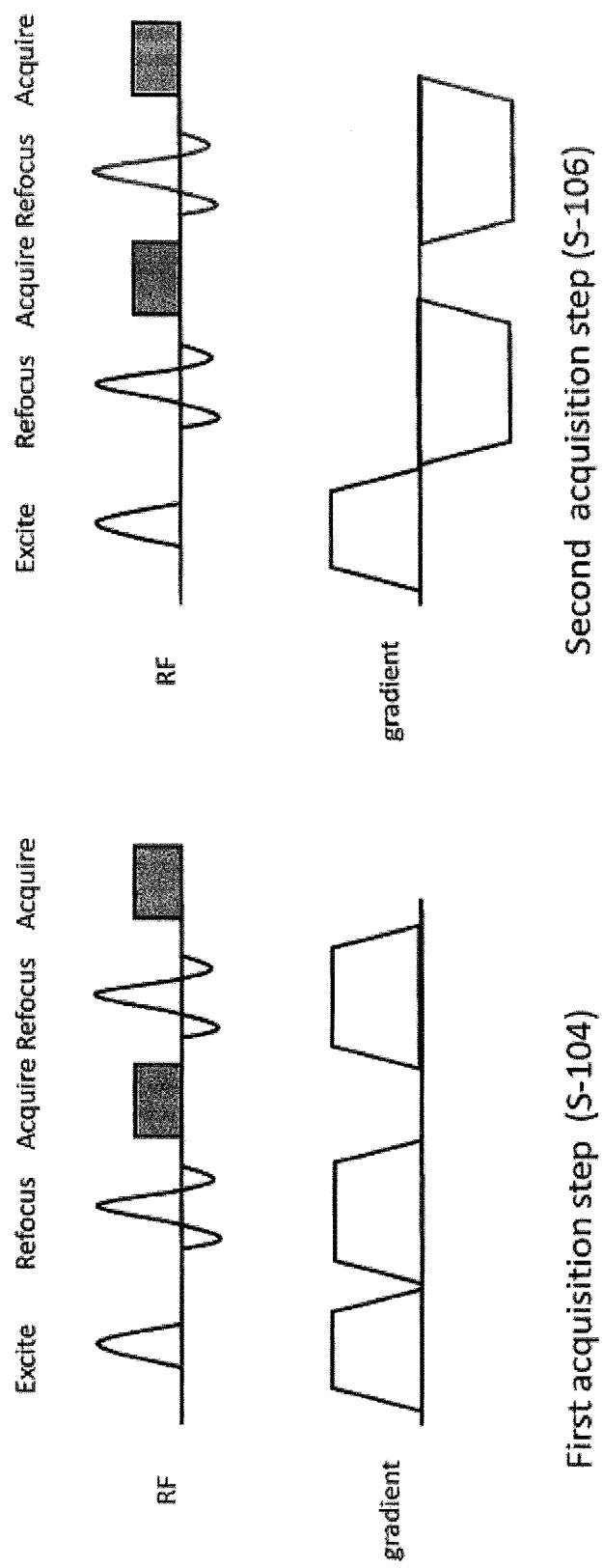

FIG. 4D represents RF pulses in S-104 and RF pulses in S-106. In FIG. 4D, gradients associated with any refocus pulse in the second acquisition step are changed and there are multiple refocus pulses for each excite pulse, resulting in multiple echoes.

Further, optionally, MRI sequence controller 30 can select and apply one or more additional sets of RF pulses after the second set of RF pulses is applied. In this embodiment this third set of RF pulses, and any additional sets of RF pulses, can include one pulses that have the same gradient as one of the pulses of the previous sets of RF pulses, or this third set of pulses, and any additional sets of pulses, can include two pulses with different gradients than any of the previous pulses of the previous sets of RF pulses. The signal data obtained from this third set of pulses, and any additional sets of pulses, can be used in generating either or both of the first image and second image.

In some embodiments, each set of pulses can include a train of RF pulses that can form two or more echoes, such as in a fast spin echo. Also, each set of pulses can include at least one excite pulse and at least one refocus pulse or any pulse that can create a suitable echo.

The acquired image data from the second pulse or set of pulses in S-106 is received by MRI data processor 42, which again samples the data to generate a second image (S-107), shown in FIG. 5. FIG. 5 illustrates when S-106 is a set of RF pulses, both of which are performed at a reverse gradient as compared to a first set of RF pulses S-104. Although the z direction is unresolved in FIGS. 3 and 5, it is shown as an example to demonstrate slice direction distortion.

MRI data processor 42 arranges the image generated in S-105 with the image generated in S-107, forming FIG. 6 for example, to compare them so that it can be determined if distortion is present in the section (S-108). In FIG. 6, the image generated in S-105 and the image generated in S-107 are overlaid or compared automatically, but in other embodiments, the images can be arranged side by side or in any configuration that allows for them to be compared to each other.

MRI data processor 42 determines if distortion is present by determining if one or both of the images contain one or more similar portions that are above a predetermined distortion threshold (S-109). Due to susceptibility fields (caused by the presence of metal elements), slice selection is distorted in relation to the amplitude and polarity of the selection gradient or gradients if they are different in S-104 as compared to in S-106. When two images of the same portion of the object are acquired with different selection gradients (amplitude and/or polarity), susceptibility fields will distort the images differently, as shown in FIG. 6. This difference can be detected by a comparison of the images by MRI data processor 42. In other embodiments, the images in FIG. 6 are compared in the image domain and can be compared by a user visually for distortion. MRI data processor 42 can also review signal differences or the sum of differences along portions of the field of view to determine if distortion is present When either S-104 or S-106 includes a set of RF pulses, and there is a difference between the selection gradient (amplitude and/or polarity) of the first RF pulse and that of the second RF pulse of the set, the distorted regions of susceptibility will appear as a signal void because the slice selection of the first and second RF pulses do not align and therefore do not form an echo in the susceptibility-affected region. In another embodiment, only one image (S-105 or S-107) from only one acquisition (S-104 or S-106, respectively) can be evaluated for the presence of signal voids. The acquisition of the second data (e.g. S-106) and its image generation (S-107) and evaluation can be avoided. MRI data processor 42 can then determine in S-109 whether the amount of signal void is above a predetermined distortion threshold.

Based on S-108, the MRI data processor determines if distortion is present in S-109. If the signal difference is below the predetermined threshold in S-108, MRI data processor 42 determines that there is an acceptable amount of distortion (S-109 No) and the MR image acquisition proceeds to step S-111 to display the image without metal element correction. Although in FIG. 6 the difference is shown as a distance away from the z axis, this is merely for illustration purposes. The predetermined threshold is not restricted to a dimension or direction but can be any difference such as a signal difference.

If the signal difference is above the predetermined threshold, MRI data processor 42 determines that there is an unacceptable amount of distortion (S-109-Yes). Distortion is determined as being caused by one or more metal elements and the scanning process proceeds to the application of metal element correction (S-110). The one or more metal elements can be any portion of a metallic substance in or on a patient undergoing MR imaging. Non-exclusive examples of these metallic substances are staples and other surgical implements, dental elements such as crowns and fillings, fixation devices such as plates, screws and pins, artificial joints, including hip implants and artificial knees, and pacemakers and other implantable electrical devices, but the method is applicable to any portion of a metallic substance in or on a patient undergoing MR imaging.

Figure 7:
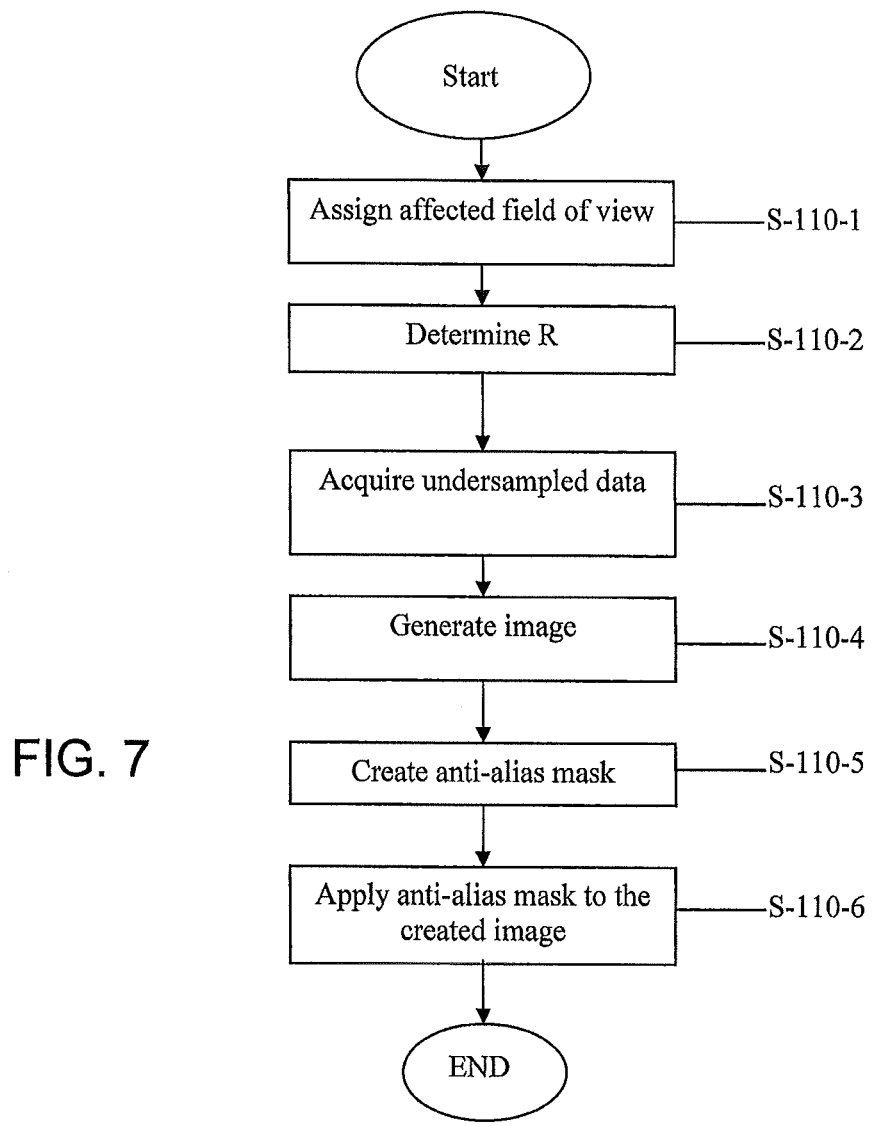
FIG. 7 is a flowchart of a metal element correction optionally completed in the flowchart in FIG. 2.

S-110 is further described in FIG. 7, which illustrates a flowchart of the application of metal element correction. When distortion is determined as being caused by one or more metal elements, the first step in metal element correction is for MRI data processor 42 to assign an affected field of view (FOV) to the compared images in FIG. 6 (S-110-1).

As can be seen in FIG. 6, the area between two lines 92 and 94 is determined to be an area experiencing distortion because the signal difference is above a predetermined threshold in this embodiment. Therefore, S-110-1 assigns the area between lines 92 and 94 as the affected FOV. In this figure the affected FOV is shown near the center of the encoded axis but the affected FOV could be at any location along the encoded axis. The total FOV is shown as 96 in FIG. 6 and spans the image scope from the left side of the figure near the z axis to the end of the image.

In this embodiment, there is one area that is affected by slice direction distortion in FIG. 6, but in other embodiments, two or more areas can be affected. In the embodiments with two or more affected areas, the affected FOV can be assigned to two or more different regions, or the affected FOV can be assigned to be a single region that encompasses all affected areas.

The MRI data processor 42 determines an acceleration factor (R) in S-110-2. This acceleration factor reduces the number of sampled data points in k-space by the determined acceleration factor. For example when R is 3, a third of the total data points in k-space are sampled resulting in a set of undersampled data. In this embodiment, R is determined by dividing the total FOV along the encoded axis by the affected FOV.

Using the determined R value, MRI data processor 42 acquires a set of undersampled ky-kz data for a full ky-kz space in S-110-3.

The undersampling pattern can be chosen so that the signal from the artifact-affected region aliases out of that region. Then, removing the aliases can be done by masking in the image domain. In one-dimension Cartesian cases, it is sufficient to increase the spacing of discrete k-space samples by any factor "Rs" where "Rs"<R.

Other sampling patterns can also be used. Hexagonal undersampled ky-kz data is one example, as described in "Hexagonal Undersampling for Faster MRI Near Metallic Implants" by Sveinsson, et al., *Magnetic Resonance in Medicine*, doi: 10.1002/mrm.25132 (2014), which is incorporated herein by reference. The full ky-kz space is composed of k-space data gathered from one or both of the sets of acquired MR data in steps S-104 and S-106 described above. The undersampled ky-kz data acquired in S-110-3 can optionally include kz oversampling to avoid or limit aliasing.

The undersampled ky-kz data are reconstructed using a Fourier transform to create an MR image in S-110-4. In this embodiment the full ky-kz space is sampled, but in other embodiments, one or more portions of ky-kz space can be sampled while the remaining portions are not sampled.

In other embodiments, the method can be used to determine the affected field of view, and acceleration factor, along any phase encoded dimension. When more than one dimension is phase encoded, such as two-dimensional or three-dimensional phase encoding, the method can be used to determine the location and size of the affected field of view in any and all encoded dimensions. The method of this further embodiment could be used for nonselective three-dimensional acquisitions where two or three dimensions are phase encoded and could be used to optimize the encoding for each of the encoded dimensions alone or in combination with each other.

An anti-alias mask is then created by MRI data processor 42 in S-110-5. This anti-alias mask is created based on the affected FOV determined in S-110-1, with the width of the anti-alias mask set to be the same or nearly the same as the width of the affected FOV. The height of the anti-alias mask, in the positive and negative direction, is set to a predetermined value based on a fixed value or a variable value that can be changed based on image requirements and is a measure of how far to sample in a frequency band. The positive height and negative height of the anti-alias mask can be set to the same value, or they can be different as compared to each other.

The anti-alias mask created in S-110-5 is applied to the MR image created in S-110-4 by MRI data processor 42 in S-110-6 using any known technique, such as that described in Sveinsson, et al. cited above. As can be seen in the third generated image of FIG. 8, the width of the anti-alias mask 100 is that of the affected FOV and in this embodiment the height is the same positively and negatively in the z direction. The anti-alias mask 100 is applied so that the central signal is kept and aliases are reduced or removed.

Figure 8:
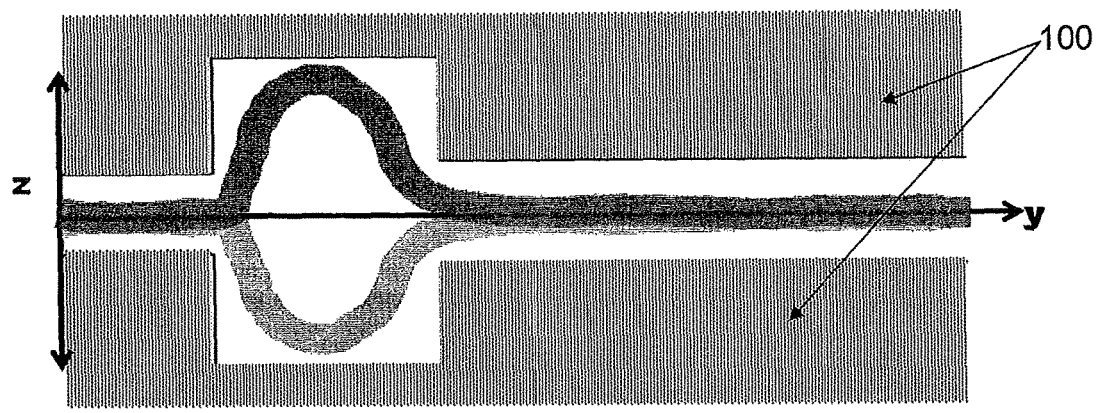
FIG. 8 is an exemplary image of a mask applied to an image.

After anti-alias mask is applied to the MR image created in S-110-4, the process proceeds to S-111 in FIG. 2, where the image of FIG. 8, which includes reduced or no distortion due to the metal element correction scan in step S-110, can be displayed. In the process of FIG. 2, Steps S-104 through S-110 can be repeated several times for different sections of the patient's body, with these sections capable of being combined into a stack and reconstructed into three dimensional volumes using known reconstruction techniques. These reconstructed three dimensional volumes can also be displayed in S-111.

In principle, specific processing orders exemplified in the embodiments described above are only examples. The specific steps can be rearranged and/or combined if desired. Further, specific pulse sequences can be changed based on various requirements such as desired scan time and desired image quality. These pulse sequences can be any suitable pulse sequence, including Spin Echo (SE), Fast Spin Echo (FSE) sequences, fast asymmetric spin echo sequences (FASE), Single Shot FSE sequences (SSFSE), Half Fourier SSFSE sequences (HASTE) or Spin-echo based Echo Planar Images (SE-EPI), among others. Also, any of the generated images can be PD, T1 or T2 weighted based on desired image outcomes.

In some embodiments, the metal element correction can be combined with view angle tilting (VAT). VAT includes a gradient applied on the slice select axis during readout, with an amplitude equal to that of the slice selection gradient. VAT pulse sequence uses a gradient on the slice select (for example, z) axis during readout that is equal in amplitude to the slice selection gradient, to eliminate or substantially eliminate in-plane distortion.

The section is then effectively viewed at an angle of:

$$\theta = \tan^{-1} * G_z/G_x$$

This causes shifts in the slice selection gradient to cancel shifts in the readout direction. VAT is capable of registering all off-resonance spins in the image plane.

VAT can also be accomplished by providing the same slice selection gradient during the readout. In this example of VAT, the frequency of all spins in the excited section will be kept within the RF excitation bandwidth, which is low enough to avoid in-plane distortion beyond the tilt of the voxels in the section.

In either embodiment, VAT removes or substantially removes the in-plane distortion that would be expected from a typical MRI scan, but still includes distortions in the slice select direction. An embodiment of the present disclosure provides apparatus and methods to eliminate in-plane and through-slice distortions.

An embodiment of the metal element correction method is described above, which can optionally be combined with VAT by MRI data processor 42 to display an image in S-111.

Additionally, while FIG. 1 generally illustrates an example of a closed MRI system, the embodiments of the present disclosure are applicable in open MRI systems and table type MRI systems, based on the requirements of the image and the type of imaging being performed.

In the embodiments described above, an example in which the MRI apparatus 100, which is a medical diagnostic imaging apparatus, performs various processes has been explained however, the embodiments are not limited thereto. For example, an image processing system including the MRI apparatus 100 and an image processing apparatus can perform the various processes described above. The image processing apparatus is, for example, a workstation, an image storage apparatus (an image server) and a viewer in PACS (Picture Archiving and Communication System), and various apparatus in an electronic health record system.

In the above described embodiments, the MRI apparatus 100 performs acquisition by the MRI sequence control unit 30. Meanwhile, the MRI data processor 42 receives the MR data and k-space data acquired by the MRI apparatus 100 or from the image server via a network, or receives the MR data and k-space data input by an operator via a recording medium, and stores these pieces of data in the MRI image memory 46. Thereafter, the MRI data processor 42 can perform the various processes described above, for example, the application of metal element correction, with respect to the MR data and k-space data stored in the storage unit.

Process steps described in the above embodiments can be performed based on a program. A computer can be configured to store the program in advance and then read the program to as to achieve the effects as those achieved by MRI apparatus 100 of the embodiments discussed above. The instructions described in the embodiments above can be recorded in a magnetic disc (a flexible disc, a hard disc or hard drive, and the like), an optical disc (a CD-ROM, a CD-R, a CD-RW, a DVD-ROM, a DVD±R, a DVD±RW and the like), a semiconductor memory, or any suitable recording medium, as a program that can be executed by a computer.

As the computer reads the program from the recording medium and executes the instructions described in the program on a CPU, operation of the MRI apparatus 100 can be realized. Further, the computer can acquire or read the program through a network when the computer acquires or reads the program.

An operating system (OS) operated on a computer based on the instructions of a program installed in the computer or an embedded system from a storage medium, middleware (MW) such as database management software and a network, and the like can perform a part of respective processes for realizing the embodiments described above. Further, the storage medium is not limited to a medium independent of the computer or the embedded system, and includes the storage medium stored or temporarily stored by downloading a program transmitted through a local area network (LAN), the Internet or any other suitable network. Also, the storage medium is not limited to one medium and when the processes in the embodiments described above are performed by a plurality of mediums.

The computer or embedded system in the embodiments above performs respective processes in the embodiments described above and can be of any configuration, such as a personal computer, a microcomputer, or a suitable processor, or a system in which a plurality of apparatus are connected by a network. The computer in the embodiments is not limited to a personal computer, can be an arithmetic processing unit incorporated in an information processor, a microcomputer or another suitable processor, with the computer representing one or more apparatus that can realize functions in the embodiments by a program.

While certain embodiments have been described, these embodiments have been presented by way of example only, and are not intended to limit the scope of the inventions. Indeed, the novel methods, apparatus and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic resonance imaging method comprising:
   selecting a first set of RF pulses;
   applying the first set of RF pulses to a portion of an object;
   generating a first image in response to signal data obtained from the first set of RF pulses;
   selecting a second set of RF pulses, wherein at least one pulse of the second set of RF pulses has a different gradient than one of the pulses of the first set of RF pulses;
   applying the second set of RF pulses to the same portion of the object as the first set of RF pulses;
   generating a second image in response to signal data obtained from the second set of RF pulses;
   comparing the first image and the second image to determine whether there is a distorted region present in the first image or the second image, each of the first image and the second image having a total field of view that is a distance of the image along an axis; assigning an affected field of view to a width of the distorted region along an axis of one or both of the first image and the second image;
   determining an acceleration factor by dividing a total field of view of one or both of the first image and the second image by the affected field of view;
   acquiring sampled image data according to the acceleration factor of one or both of the first image and the second image;
   generating a third image from the acquired sampled image data and applying a mask to the third image in the affected field of view; and
   displaying the third image.

2. The magnetic resonance imaging method of claim 1, wherein each pulse of the second set of RF pulses has a different gradient than each pulse of the first set of RF pulses.

3. The magnetic resonance imaging method of claim 1, wherein each pulse of the first set of RF pulses has a different gradient than each pulse of the second set of RF pulses.

4. The magnetic resonance imaging method of claim 1, wherein each set of pulses comprises a first excitation pulse and a second refocus pulse.

5. The magnetic resonance imaging method of claim 1, wherein each set of pulses comprises a first excitation pulse and two or more second refocus pulses.

6. The magnetic resonance imaging method of claim 1, further comprising selecting and applying one or more additional sets of pulses after the second set of RF pulses is applied.

7. The magnetic resonance imaging method of claim 1, wherein a width of the mask is set to be the same as the affected field of view.

8. The magnetic resonance imaging method of claim 1, wherein the mask reduces or removes aliases from the third image.

9. The magnetic resonance imaging method of claim 1, further comprising a step of correcting a readout distortion by applying view angle tilting.

10. A magnetic resonance imaging method comprising:
    selecting a first RF pulse;
    applying the first RF pulse to a portion of an object;
    selecting a second RF pulse, the second RF pulse being at a different gradient than the first RF pulse, at a different bandwidth than the first RF pulse or at a different gradient and a different bandwidth than the first RF pulse;
    applying the second RF pulse to the same portion of the object as the first RF pulse; generating an image in response to signal data obtained from the second RF pulse;
    determining whether there is a distorted region present in the data of the image, with the image having a total field of view that is the distance of the image along an axis;

assigning an affected field of view to a width of the distorted region along the axis of the image;

determining an acceleration factor by dividing the total field of view of the image by the affected field of view;

acquiring sampled image data according to the acceleration factor of the image;

generating a second image from the acquired sampled image data and applying a mask to the second image in the affected field of view; and displaying the second image.

11. The magnetic resonance imaging method of claim 10, wherein a width of the mask is set to be the same as the affected field of view.

12. The magnetic resonance imaging method of claim 10, wherein the mask reduces or removes aliases from the second image.

13. The magnetic resonance imaging method of claim 10, further comprising a step of correcting a readout distortion by applying view angle tilting.

14. The magnetic resonance imaging method of claim 10, wherein the second RF pulse is an excitation pulse.

15. The magnetic resonance imaging method of claim 10, wherein the second RF pulse is a refocus pulse.

16. A magnetic resonance imaging apparatus comprising:

a magnetic resonance imaging sequence controller that is configured to select a first set of RF pulses, select a second set of RF pulses where at least one pulse of the second set of RF pulses has a different gradient than one of the pulses of the first set of RF pulses, apply the first set of RF pulses to a portion of an object, apply the second set of RF pulses to the same portion of the object as the first set of RF pulses, a magnetic resonance imaging processor configured to generate a first image from obtained signal data of the first set of RF pulses and generate a second image from obtained signal data of the second set of RF pulses, compare the first image and the second image to determine whether there is a distorted region present in the first image or the second image, assign an affected field of view to a width of the distorted region along an axis of one or both of the first image and the second image, determine an acceleration factor by dividing a total field of view of one or both of the first image and the second image by the affected field of view and acquire sampled k-space data according to the acceleration factor of one or both of the first image and second image.

17. The magnetic resonance imaging apparatus of claim 16, wherein the magnetic resonance imaging processor generates a third image from the acquired sampled image data and the magnetic resonance imaging sequence controller applies a mask to the third image in the affected field of view.

* * * * *